US00RE49286E

(19) United States
(12) Reissued Patent
Jung et al.

(10) Patent Number: US RE49,286 E
(45) Date of Reissued Patent: *Nov. 8, 2022

(54) METHOD OF MAKING FLIP CHIP

(71) Applicant: RESEARCH & BUSINESS FOUNDATION SUNGKYUNKWAN UNIV., Suwon-si (KR)

(72) Inventors: Seung Boo Jung, Seoul (KR); Jong Woong Kim, Suwon (KR)

(73) Assignee: RESEARCH & BUSINESS FOUNDATION SUNGKYUNKWAN UNIV., Suwon-si (KR)

( * ) Notice: This patent is subject to a terminal disclaimer.

(21) Appl. No.: 17/164,378

(22) Filed: Feb. 1, 2021

Related U.S. Patent Documents

Reissue of:
(64) Patent No.: 8,048,793
Issued: Nov. 1, 2011
Appl. No.: 12/203,280
Filed: Sep. 3, 2008

U.S. Applications:
(63) Continuation of application No. 16/275,199, filed on Feb. 13, 2019, now Pat. No. Re. 48,422, which is a
(Continued)

(30) Foreign Application Priority Data

Sep. 5, 2007 (KR) ..... 10-2007-0089905

(51) Int. Cl.
*H01L 21/60* (2006.01)
*H01L 23/00* (2006.01)
*H01L 21/48* (2006.01)

(52) U.S. Cl.
CPC ..... *H01L 24/13* (2013.01); *H01L 21/4853* (2013.01); *H01L 24/11* (2013.01);
(Continued)

(58) Field of Classification Search
CPC ..... H01L 21/60; H01L 23/12; H01L 23/498
See application file for complete search history.

(56) References Cited

U.S. PATENT DOCUMENTS 5,130,275 A * 7/1992 Dion ..... 438/614
5,541,135 A 7/1996 Pfeifer et al.
(Continued)

FOREIGN PATENT DOCUMENTS

JP 4397583 B2 1/2010
KR 10-2006-0018621 A 3/2006
(Continued)

OTHER PUBLICATIONS

Notice to File a Response in Korean Application No. 10-2007-0089905.

*Primary Examiner* — Deandra M Hughes
(74) *Attorney, Agent, or Firm* — K&L Gates LLP

(57) ABSTRACT

Disclosed is a method for manufacturing a flip chip, in which a gold typically used in a flip chip manufacturing is adhered by conductive adhesives, wherein the method comprises steps of depositing a metal seed layer on a substrate; applying and patterning a photoresist or a dry film; forming a gold bump by electroplating; patterning the seed layer; forming an insulating layer on the seed layer and upper end of the gold bump; and patterning an insulating layer. Accordingly, it is possible to manufacture a flip chip, in which electrical function between bumps can be evaluated, with less cost.

17 Claims, 6 Drawing Sheets

Related U.S. Application Data continuation of application No. 16/274,191, filed on Feb. 12, 2019, now Pat. No. Re. 48,421, which is an application for the reissue of Pat. No. 8,048,793.

(52) U.S. Cl.

CPC ..... *H01L 2224/0231* (2013.01); *H01L 2224/0401* (2013.01); *H01L 2224/05166* (2013.01); *H01L 2224/05644* (2013.01); *H01L 2224/05647* (2013.01); *H01L 2224/1147* (2013.01); *H01L 2224/13099* (2013.01); *H01L 2224/13144* (2013.01); *H01L 2224/1411* (2013.01); *H01L 2924/014* (2013.01); *H01L 2924/01005* (2013.01); *H01L 2924/01006* (2013.01); *H01L 2924/01013* (2013.01); *H01L 2924/01015* (2013.01); *H01L 2924/01019* (2013.01); *H01L 2924/01022* (2013.01); *H01L 2924/01029* (2013.01); *H01L 2924/01033* (2013.01); *H01L 2924/01072* (2013.01); *H01L 2924/01074* (2013.01); *H01L 2924/01078* (2013.01); *H01L 2924/01079* (2013.01); *H01L 2924/01082* (2013.01); *H01L 2924/09701* (2013.01); *H01L 2924/10329* (2013.01); *H01L 2924/3025* (2013.01)

(56) References Cited

U.S. PATENT DOCUMENTS

| | | | | |
|---|---|---|---|---|
| 7,485,967 | B2 * | 2/2009 | Kameyama et al. | 257/774 |
| 7,723,225 | B2 * | 5/2010 | Lin et al. | 438/612 |
| RE48,421 | E * | 2/2021 | Jung | H01L 24/05 |
| RE48,422 | E * | 2/2021 | Jung | H01L 24/03 |
| 2004/0040855 | A1 | 3/2004 | Batinovich | |
| 2005/0277283 | A1 * | 12/2005 | Lin et al. | 438/618 |
| 2006/0019490 | A1 * | 1/2006 | Chou et al. | 438/637 |
| 2007/0275503 | A1 * | 11/2007 | Lin et al. | 438/106 |

FOREIGN PATENT DOCUMENTS

| | | |
|---|---|---|
| KR | 1020060018621 | 3/2006 |
| KR | 10-2007-0059842 A | 6/2007 |

* cited by examiner

Prior Art

Fig. 6
(Amended)
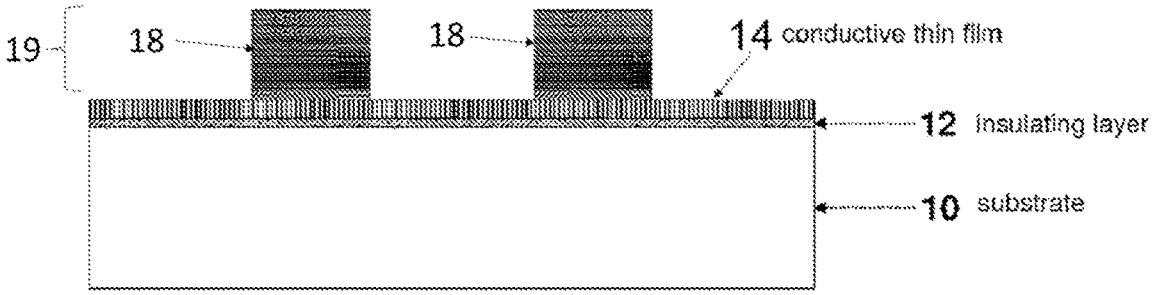
Fig. 7
(Amended)
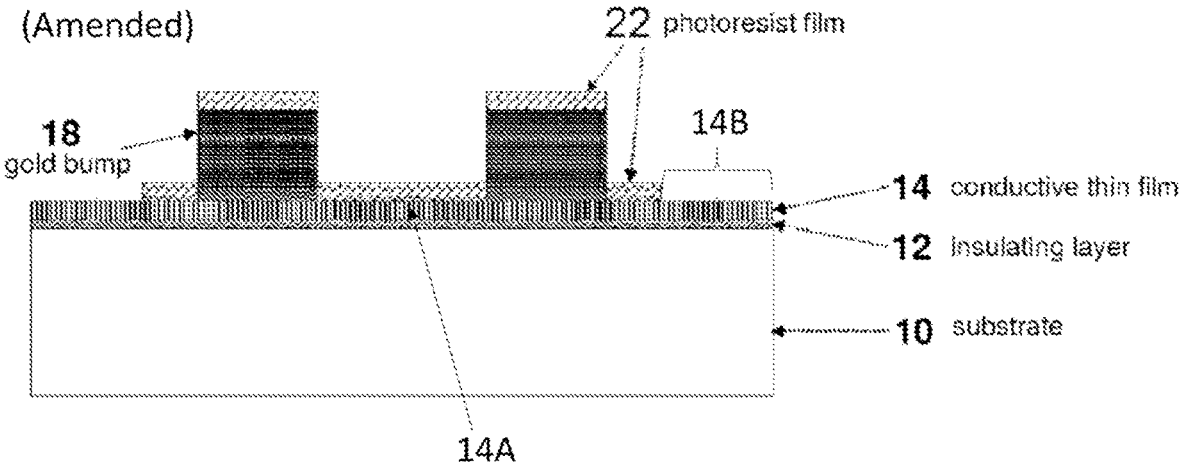

Fig. 10
(Amended)
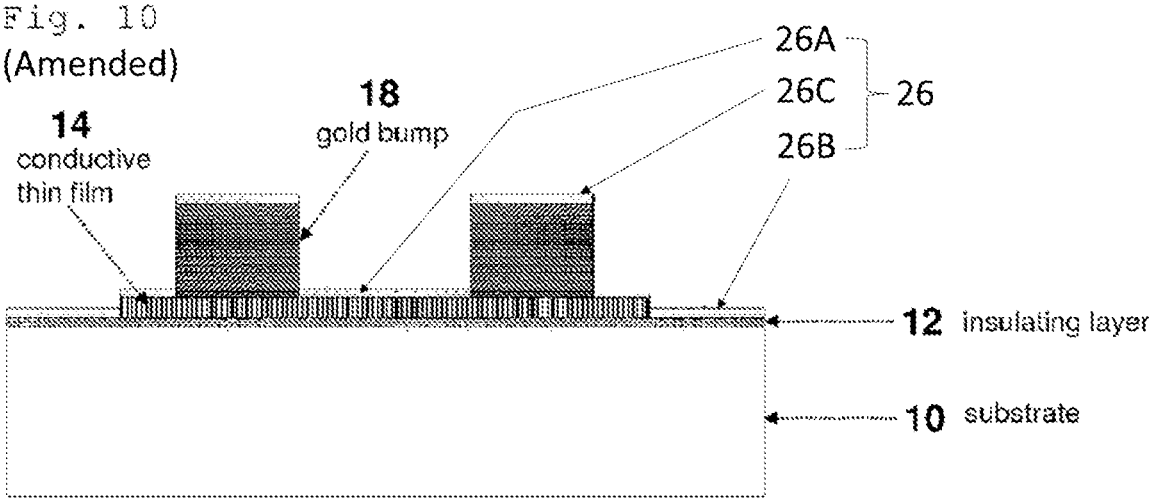

Fig. 11
(Amended)
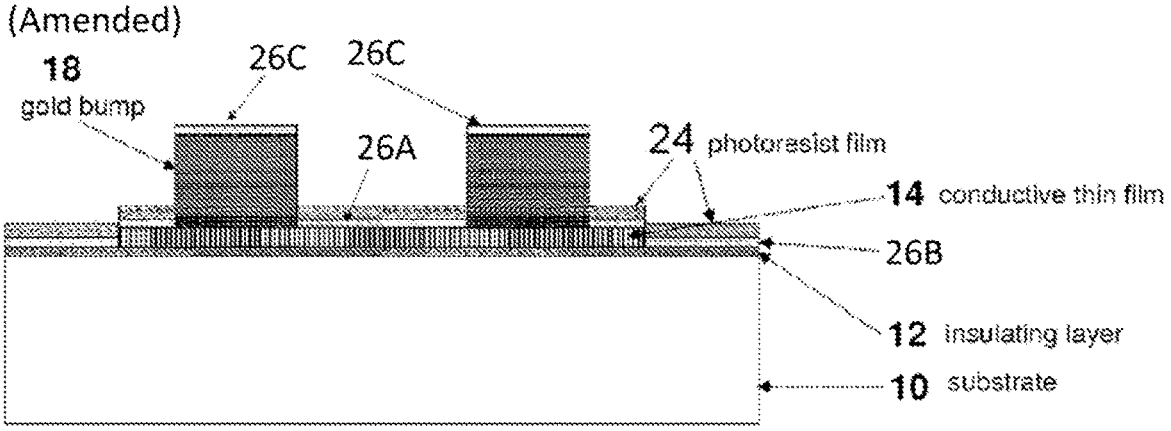
Fig. 12
(Amended)
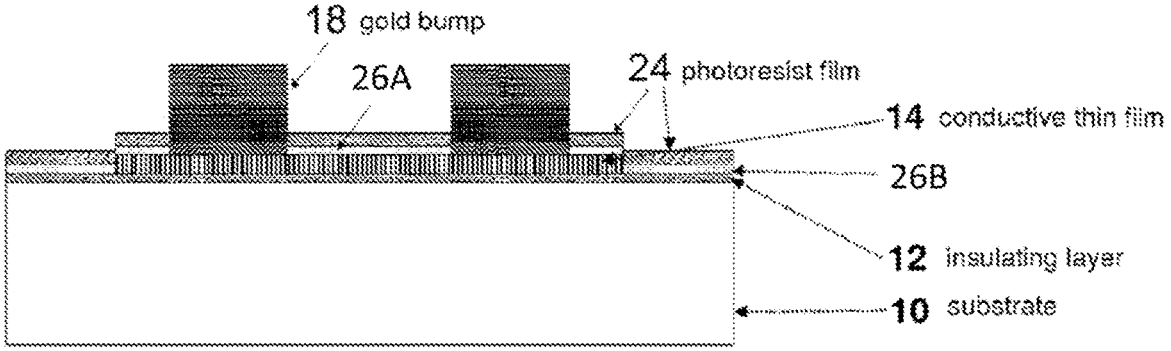
Fig. 13
(Amended)
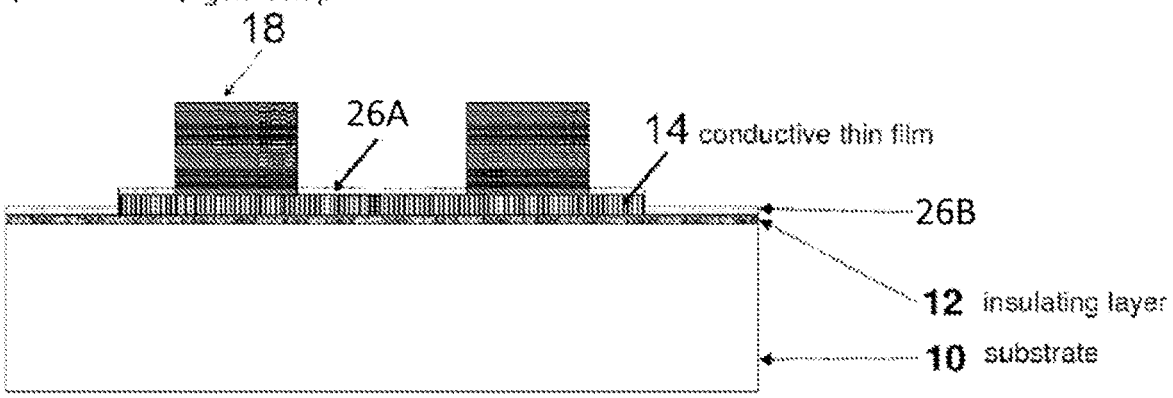

METHOD OF MAKING FLIP CHIP

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*CROSS-REFERENCE TO RELATED REISSUE APPLICATION*

*This application is a continuation reissue application of application Ser. No. 16/275,199 filed Feb. 13, 2019, which is a continuation reissue application of application Ser. No. 16/274,191 filed Feb. 12, 2019, which is an application for reissue of U.S. Pat. No. 8,048,793.*

CROSS-REFERENCE TO RELATED APPLICATION

This application claims under 35 U.S.C. § 119(a) the benefit of Korean Patent Application No. 10-2007-0089905 filed Sep. 5, 2007, the entire contents of which are incorporated herein by reference.

TECHNICAL FIELD

The present invention relates to a flip chip packaging technique, in which a chip and a substrate are electrically and mechanically connected with each other after the chip is flipped so as to allow a pad of the chip and the substrate to face each other.

BACKGROUND ART

A flip chip package has a small size and has superior electric characteristic and reliability in comparison with a package formed by a wire bonding technique. The flip chip package is obtained by directly bonding a semiconductor chip and a printed circuit board (PCB) substrate by using a metallic bump. Gold, copper and solder, etc. are applied as the metal bump. Among these, a flip-chip using a gold bump is typically bonded to a substrate by using conductive adhesives. Different from a chip using solder bumps, such a flip chip using the gold bump has recently been popular in a display field because it doesn't include harmful element such as lead to environment and human health and has superior bonding reliability.

A method for forming a gold bump includes an electroplating method, a vacuum depositing method, and a method forming a stud bump by wire bonding. Among these, the electroplating is most advantageous due to a simple manner and the low manufacturing costs.

A research for manufacturing a gold bump of a flip chip by using this electroplating method has been actively proceeded. For example, Korean patent publication NO. 10-2006-0044929 discloses a method for improving non-uniformity of a thickness of the gold bump in such a manner that metal with a low melting point is plated on a bump formed by plating or an alloy having a dome shape is formed thereon. However, after a formation of a gold bump by electroplating, the entire metallic seed layer, except for the gold bump, is etched so that only the gold bump remains on a wafer. Therefore, there is a disadvantage in that it is impossible to evaluate the electrical characteristics of the gold bump and a flip chip package bonded through electrical connection with the gold bump.

Korean patent registration NO. 10-0574986 discloses a method for forming a bump through an electroplating for a flip chip connection. A seed layer is formed for electroplating, and a shielding layer and a photosensitive mask are formed on the seed layer. Then, the exposed shielding layer, which has undergone a photolithography process and a developing process, is removed through dry etching, and a bump is formed on the exposed seed layer according to a plating method.

However, in the method according to the invention, the gold bump is formed by electroplating after the metal patterning and the shielding layer are formed. Therefore, it is necessary that an electrode wiring for forming the gold bump is formed when the metal pattern is formed, or a metallic seed layer for plating is formed and moved on a top of an insulating layer. Typically, the electrode wire is an unnecessary metal wire in an actual chip so that it has to be removed again after the gold bump is formed. Therefore, an additional process is necessary before and after the gold bump is formed thereby causing inconvenience.

As a similar example, a method for manufacturing a gold bump on an aluminum substrate by an electroplating method is announced [reference: John H. Lau, C. P. Wong, Ning-Cheng Lee, O. W. Ricky Lee, Electronics Manufacturing with Lead-free, Halogen-free, and Conductive-adhesive materials, 4.1-4.9 (2003)]. The process as shown in FIG. 1 is performed in the announced reference. That is, according to the method, an insulating layer is formed on an aluminum pad and the top of the pad, and a metal seed layer for electroplating of a gold bump is formed again on the upper part of the insulating layer. Then, after a formation of the gold bump, the metal seed layer applied for plating is finally removed. Similar to the disclosed invention, this method requires forming and removing process of a metal seed layer to perform electroplating, and, thus, a manufacturing procedure becomes too complicated. Also, conventionally, a mask for photolithography, which is used for plating the gold bump, and a mask for photolithography, which is used in patterning an insulating layer formed on the top of a conductive film, are separately manufactured.

The above information disclosed in this Background Art section is only for enhancement of understanding of the background of the invention and therefore it may contain information that does not form the prior art that is already known in this country to a person of ordinary skill in the art.

SUMMARY

Therefore, the present invention has been made in view of the above-mentioned problems, and it is an object of the present invention to provide a method for evaluating the electrical connection between gold bumps and a method for improving a flip chip manufacturing process in forming a flip chip.

According to the present invention, a metal seed layer used in electroplating for forming a bump is directly used as metal pattern for forming electrical connection between bumps, so that an electrical function between bumps can be evaluated, and it is possible to omit the processes of forming and removing an electrode wire only for electroplating, which have been essential in the prior art.

According to an aspect of the present invention, there is provided a flip chip comprising: an insulating layer arranged on a substrate; a metal patterned seed layer arranged on the insulating layer; and a plate bump layer formed on the metal seed layer, wherein the metal pattern is formed at a side of the plate bump, and is formed by patterning the metal seed layer.

It is preferable that the substrate is one selected from the group consisting of a silicon wafer, a compound semiconductor, quartz, glass, and ceramic material.

The insulating layer preferably comprises $SiO_2$ and $Si_3N_4$.

The seed layer preferably comprises an adhesive layer and an electrode layer.

The adhesive layer preferably comprises titanium, and the electrode layer comprises copper or gold.

According to another aspect of the present invention, there is provided a flip chip manufacturing method comprising: (a) forming a seed layer on a substrate by using a conductive thin layer; (b) applying and patterning a photoresist or a dry film; (c) forming a gold bump by electroplating; (d) patterning the seed layer; (e) forming an insulating layer on the seed layer and the upper end of the gold bump; and (f) applying and patterning a photoresist or a dry film so as to pattern the insulating layer.

It is preferable that the patterning of steps (b) and (f) are performed by photolithography. Suitably, a photolithography mask used in the patterning processes of step (b) is the same as that of step (f).

It is preferable that the polarity of the photoresist or the dry film of step (b) and that of step (f) are opposite.

Also, it is preferable that the patterning process of step (d) comprises applying and patterning a photoresist or a dry film and etching a portion of the conductive thin film on which portion the photoresist or the dry film is not, so as to form a metal pattern for electrical connection between gold bumps.

In the present invention, it is possible to omit the process of forming and removing an electrode wire by directly utilizing a metal seed layer, which is used for plating, as a metal pattern for electrical connecting between bumps. Therefore, the cost of material and a process cost can be lowered. Also, it is possible to evaluate an electrical function between the bumps by using such a metal pattern so that a flip chip having high reliability can be manufactured.

Also, it is possible to unify a mask for photolithography, which is used for plating a gold bump in such a manner that the polarity of a photoresist or a dry film is opposite, and a mask for photolithography, which is used for pattering an insulating layer formed at an upper part of a conductive film, so that an additional unit manufacturing cost can be reduced. Also, a daisy chain, etc. can be formed by patterning a seed layer for electroplating so that electrical function of a flip chip package can be evaluated.

BRIEF DESCRIPTION OF THE DRAWINGS

The above and other objects, features and advantages of the present invention will become more apparent from the following detailed description when taken in conjunction with the drawings in which:

FIG. 6 is a view illustrating a structure where a photoresist or a dry film has been removed;

FIG. 7 is a view illustrating a structure where photolithography is performed after a photoresist or a dry film is applied so as to etch a conductive thin film;

FIG. 10 is a view illustrating a structure where an insulating layer is formed;

FIG. 11 is a view illustrating a structure where photolithography is performed after a photoresist or a dry film is applied so as to etch an insulating layer;

FIG. 12 is a view illustrating a structure where an insulating layer is etched;

FIG. 13 is a view illustrating a structure where a photoresist or a dry film is removed.

DETAILED DESCRIPTION

Hereinafter reference will now be made in detail to various embodiments of the present invention, examples of which are illustrated in the accompanying drawings and described below. While the invention will be described in conjunction with exemplary embodiments, it will be understood that present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

Figure 1:
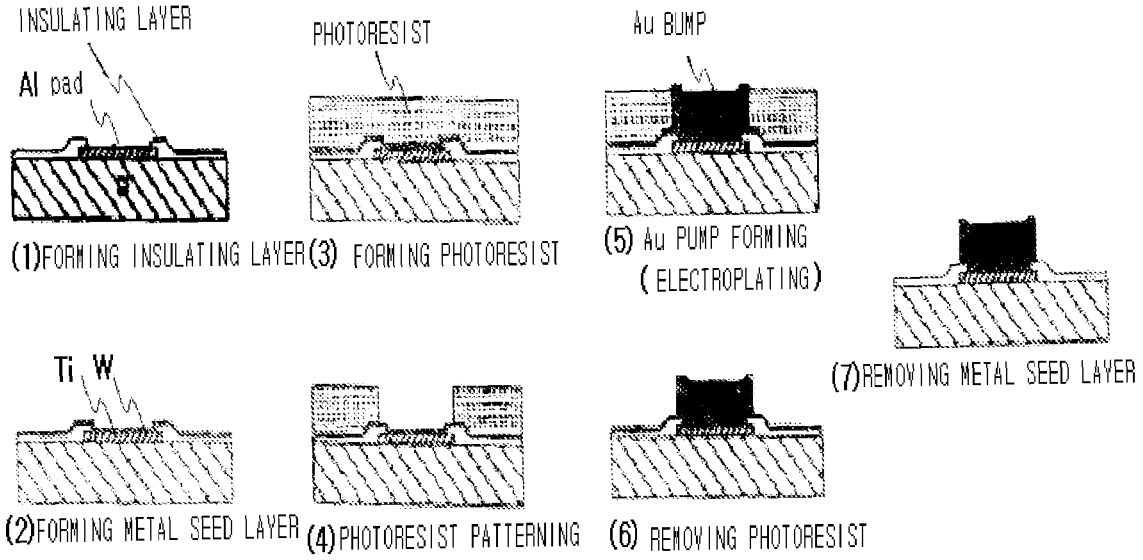
FIG. 1 is a schematic view illustrating a conventional procedure of manufacturing a gold bump.
Figure 2:
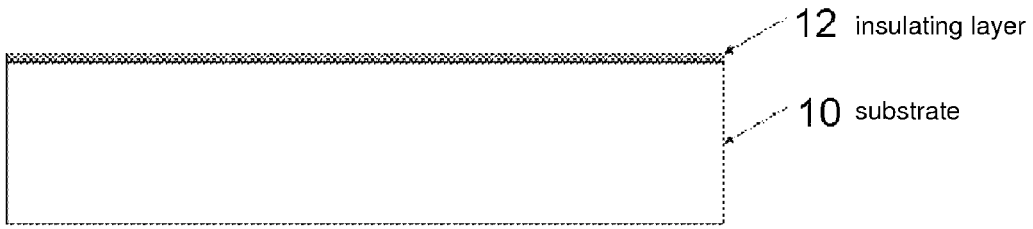
FIG. 2 is a schematic view illustrating a structure where an insulating layer is formed on the upper part of a substrate.

As shown in FIG. 2, an insulating layer 12 is formed so as to prevent electrical connection between a substrate 10 and an upper bump. Examples of the insulating layer 12 include $SiO_2$, $Si_3N_4$, and the like.

Figure 3:
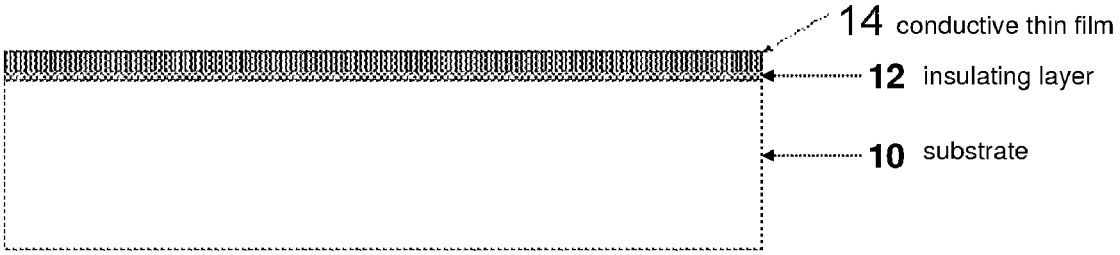
FIG. 3 is a view illustrating a structure where a conductive thin film for plating is formed on the upper part of an insulating layer.

As shown in FIG. 3, a conductive thin film 14 is formed so as to be used as a metal seed layer in electroplating. At this time, the conductive thin film 14 is divided into an adhesion layer and an electric wire layer (an electrode layer). Preferably, as the adhesive layer for improving bonding force of the conductive thin film 14, titanium (Ti) may preferably be formed with a height of about 10 nm to 100 nm. As the electrode layer functioning as an electrical passage, copper (Cu) or gold (Au), etc. may suitably be formed with a height of about 100 nm to 1,000 nm.

Figure 4:
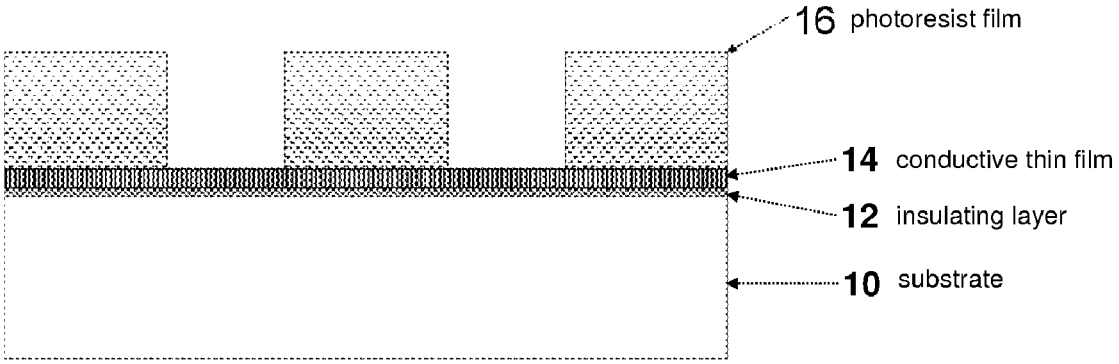
FIG. 4 is a view illustrating a structure where a plating wall is formed at an upper part of a conductive thin film so as to plate a gold bump, in which the plating wall is made from photoresist or a dry film.

FIG. 4 is a structure where a photoresist or a dry film 16 is applied so as to form the shape of a gold bump 18 before electroplating of the gold bump 18. Photolithography may be performed by using a mask coated with chrome for patterning. It is preferable that the thickness of the photoresist or the dry film is about 20 μm. Moreover, the size of the gold bump can be made bigger or smaller than the size of the chip pad, when necessary.

Figure 5:
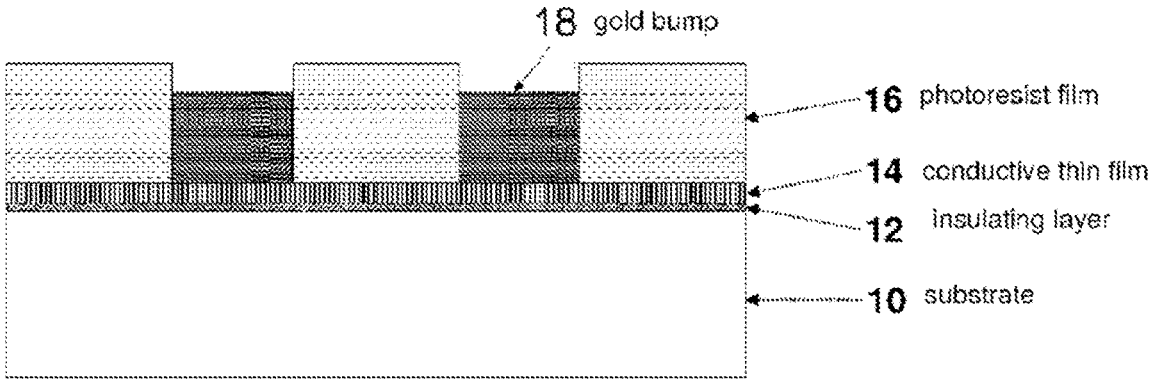
FIG. 5 is a view illustrating a structure where gold is formed by electroplating so as to form a gold bump.

As shown in FIG. 5, gold is electroplated so as not to exceed the height of the patterned photoresist or the dry film 16. It is preferable that the height of the gold bump is about 10 nm to 19 μm.

As shown in FIG. 6, the photoresist or dry film 16 is removed when the gold [bump] *bumps* 18 [is] *are* completely formed by electroplating. *The gold bumps 18 constitute a plate bump layer 19.*

In order to achieve an electrical connection between bumps, a process of patterning the conductive thin film 14 used as a seed layer in plating is performed. As shown in FIG. 7, for example, a photoresist or dry film 22 is disposed *on the conductive thin film 14* and patterned by photolithography using a new mask *to provide a first portion 14A covered by the patterned photoresist 22 and a second portion 14B not covered by the patterned photoresist 22.*

Figure 8:
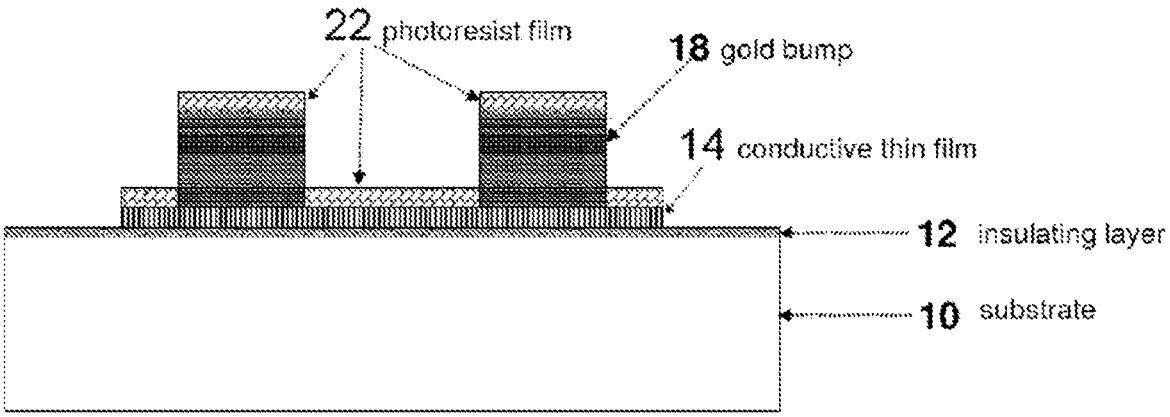
FIG. 8 is a view illustrating a structure where a metal etching process is performed so as to pattern a conductive thin film.

A metal etching process is then performed so as to remove the *second* portion *14B* of the conductive thin film 14, to which the photoresist or the dry film 22 is not disposed. Titanium (Ti) can be etched by hydrofluoric acid (HF) diluted solution, Au can be etched by iodination potassium (KI) solution, and Cu can be etched by ferric chloride ($FeCl_3$) aqueous solution. Through this etching process, the shape in which the conductive thin film 14 is patterned can be obtained, as shown in FIG. 8.

Figure 9:
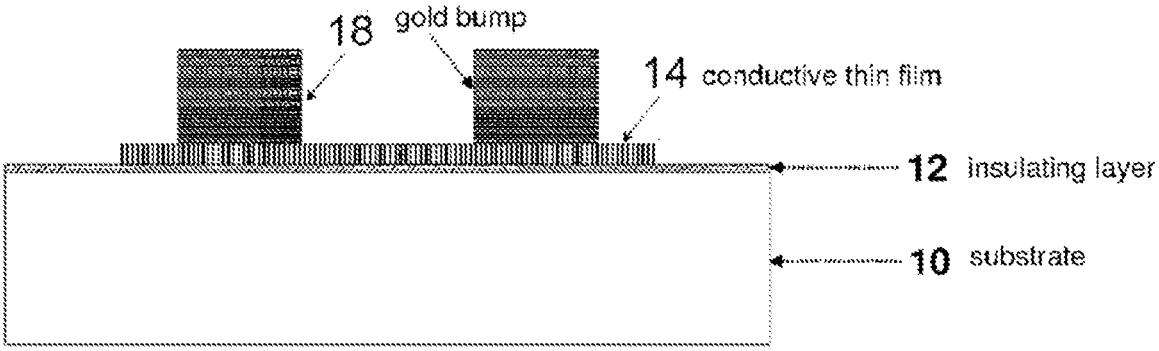
FIG. 9 is a view illustrating a structure where a photoresist or a dry film is removed.

FIG. 9 shows a structure where the photoresist or dry film 22 used for etching of the conductive thin film 14 has been removed.

As shown in FIG. 10, an insulating layer 26 is formed so as to protect the thin conductive film 14 and achieve insulation from external environment. *The insulating layer 26 includes insulating layers 26A, 26B and 26C that are formed on different surfaces.* $SiO_2$, $Si_3N_4$, etc. may suitably be used as the insulating layer 26.

As shown in FIG. 11, a photoresist and dry film 24 is disposed *on the insulating layer 26,* and patterning is performed through the photolithography process*, which provides the patterned photoresist film 24 on the insulating layers 26A and 26B but not on the insulating layer 26C,* so as to achieve patterning of the insulating layer 26. Suitably, the mask used in this photolithography may be the same as the mask used in the process of FIG. 4, except that the polarity of the photoresist or dry film 24 is changed. For example, in a case where the photoresist or dry film 16 used in FIG. 4 is positive, the photoresist or dry film 24 used in FIG. 11 is negative so as to achieve a patterning having an opposite shape. Through such a process, two processes can be performed by using one mask.

As shown in FIG. 12, the insulating layer [26] *26C* is etched so as to expose the surface of the gold bump 18 *while the insulating layers 26A and 26B are maintained under the patterned photoresist film 24.*

As shown in FIG. 13, the photoresist or dry film 24 is removed, which was applied to etch the insulating layer [26] *26C.*

Figure 14:
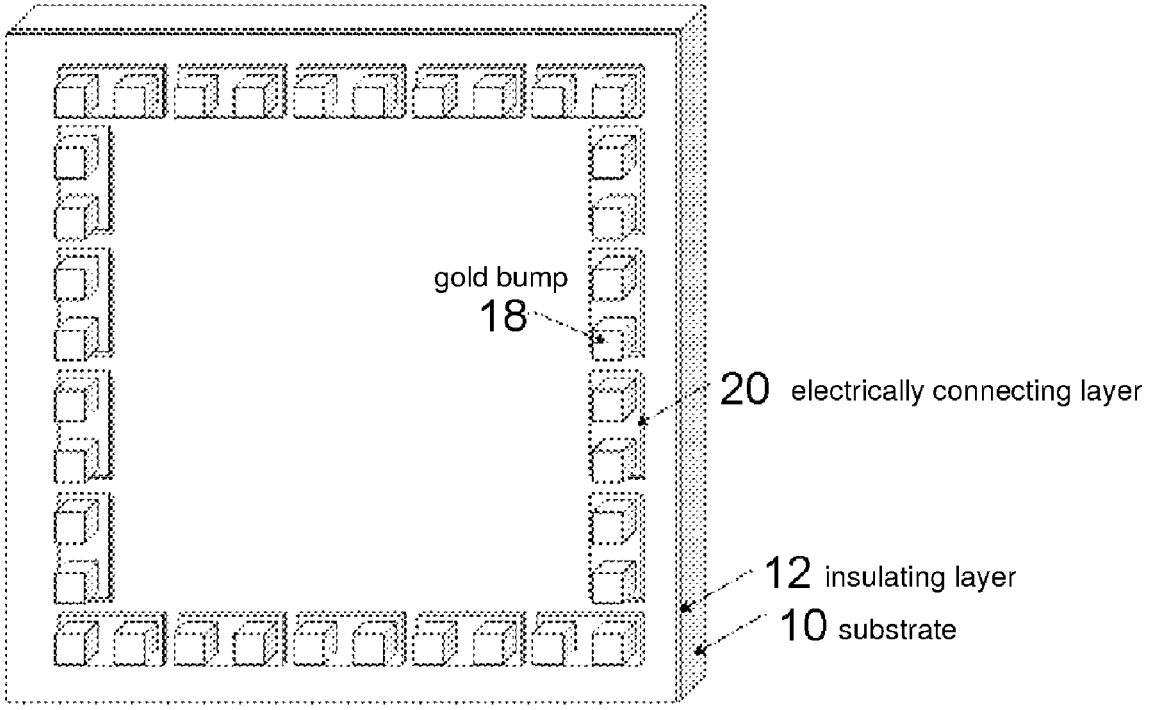
FIG. 14 is a view illustrating a flip chip manufactured through the processes of FIGS. 2 to 13.

FIG. 14 is a top view of a flip-chip manufactured through the processes of FIGS. 2 to 13, which includes thereon the insulating layer 12 formed between the substrate 10 and the conductive film 14, the gold bump 18 formed by electroplating, and the electrically connecting layer (*metal patterned seed layer*) 20 formed by patterning the conductive thin film used as the seed layer in electroplating.

The present flip chips and manufacturing methods thereof can be applied to various areas. For example, it is possible to bond a core memory chip and a non-memory chip and stack a horizontal multi chip and a vertical multi chip, in the fields of high-end electronic machines, including, but not limited to, portable multimedia machines, such as cellular phones, and flat panel machines.

The invention has been described in detail with reference to preferred embodiments thereof. However, it will be appreciated by those skilled in the art that changes may be made in these embodiments without departing from the principles and spirit of the invention, the scope of which is defined in the appended claims and their equivalents.

The invention claimed is:

[1. A flip chip comprising:

an insulating layer arranged on and directly contacted with a substrate, wherein the insulating layer covers the substrate;

a metal patterned seed layer arranged on the insulating layer and directly contacted with the insulating layer; and a plate bump layer formed on the metal patterned seed layer, wherein one or more plate bumps are formed;

wherein a metal pattern is formed at a side of the plate bump, and is formed by patterning the metal patterned seed layer; wherein the metal pattern is at least a part of the metal patterned seed layer, and forms electrical connection between the plate bumps.]

[2. The flip chip as claimed in claim 1, wherein the substrate is one selected from the group consisting of a silicon wafer, a compound semiconductor, quartz, glass, and ceramic material.]

[3. The flip chip as claimed in claim 1, wherein the insulating layer comprises $SiO_2$ or $Si_3N_4$.]

[4. The flip chip as claimed in claim 1, wherein the seed layer comprises an adhesive layer and an electrode layer.]

[5. The flip chip as claimed in claim 4, wherein the adhesive layer comprises titanium, and the electrode layer comprises copper or gold.]

[6. A flip chip manufacturing method comprising:

(a) forming a seed layer on a substrate by using a conductive thin layer;

(b) applying and patterning a photoresist or a dry film;

(c) forming gold bumps by electroplating;

(d) patterning the seed layer to form a metal pattern;

(e) forming an insulating layer on the seed layer and the upper end of the gold bumps; and (f) applying and patterning a photoresist or a dry film so as to pattern the insulating layer;

wherein the metal pattern forms electrical connection between the gold bumps, and the polarity of the photoresist or a dry film in step b) is opposite to the polarity of photoresist or a dry film in step f).]

[7. The flip chip manufacturing method as claimed in claim 6, wherein the patterning of steps (b) and (f) are performed by photolithography.]

[8. The flip chip manufacturing method as claimed in claim 7, wherein a photolithography mask used in the patterning processes of step (b) is the same as that of step (f).]

[9. The flip chip manufacturing method as claimed in claim 6, wherein the patterning process of step (d) comprises applying and patterning a photoresist or a dry film and etching a portion of the conductive thin film on which portion the photoresist or the dry film is not, so as to form a metal pattern for electrical connection between gold bumps.]

*10. A flip chip manufacturing method comprising:*

*(a) forming a seed layer on a substrate by using a conductive thin layer;*

*(b) applying and patterning a photoresist or a dry film;*

*(c) forming gold bumps by electroplating;*

*(d) patterning the seed layer to form a metal pattern;*

*(e) forming an insulating layer on the seed layer and the upper end of the gold bumps; and*

*(f) applying and patterning a photoresist or a dry film so as to pattern the insulating layer,*

*wherein the metal pattern forms electrical connection between the gold bumps, and the polarity of the photoresist or a dry film in the step (b) is opposite to the polarity of photoresist or a dry film in the step (f),*

*wherein the step (b) of applying and patterning comprises forming a photoresist layer over the seed layer and patterning the photoresist layer to form at least two openings to expose the seed layer through the photoresist layer,*

*wherein the step (c) of forming gold bumps comprises electroplating at least two gold bumps in the at least two openings in which the seed layer works as an electrode for electroplating so that an electrode wire does not have to be formed for each of the gold bumps.*

*11. The method of claim 10,*

*wherein subsequent to electroplating, the photoresist layer over the seed layer is removed to provide an intermediate structure that comprises the substrate, the seed layer on the substrate, and the at least two gold bumps formed on the seed layer.*

*12. The method of claim 10,*

*wherein patterning the seed layer in the step (d) maintains a first portion of the seed layer and removes a second portion of the seed layer which exposes a portion of the substrate, whereby the metal pattern formed in the step (d) comprises the first portion of the seed layer and does not comprise the second portion of the seed layer,*

*wherein the insulating layer formed in the step (e) is provided over the upper end of the at least two gold bumps and over the first portion of the seed layer,*

*wherein the step of (f) applying and patterning removes the insulation layer provided over the upper end of the at least two gold bumps while maintaining the insulation layer over the first portion of the seed layer,*

*wherein the method provides a flip chip device comprising the substrate, the metal pattern, the at least two gold bumps, and the insulating layer, wherein the metal pattern is formed on the substrate and comprises the first portion of the seed layer that interconnects the at least two gold bumps, wherein the insulating layer remains over the first portion of the seed layer.*

*13. The method of claim 10,*

*wherein patterning the seed layer in the step (d) maintains a first portion of the seed layer and removes a second portion of the seed layer which exposes a portion of the substrate, whereby the metal pattern formed in the step (d) comprises the first portion of the seed layer and does not comprise the second portion of the seed layer,*

*wherein the insulating layer formed in the step (e) is provided over the upper end of the at least two gold bumps, over the first portion of the seed layer, and over the portion of the substrate exposed by removal of the second portion of the seed layer,*

*wherein the step of (f) applying and patterning removes the insulation layer provided over the upper end of the at least two gold bumps while maintaining the insulation layer over the first portion of the seed layer and also maintaining the insulation layer over the portion of the substrate exposed by removal of the second portion of the seed layer,*

*wherein the method provides a flip chip device comprising the substrate, the metal pattern, the at least two gold bumps, and the insulating layer, wherein the metal pattern is formed on the substrate and comprises the first portion of the seed layer that interconnects the at least two gold bumps, wherein the insulating layer remains over the first portion of the seed layer and over the portion of the substrate exposed by removal of the second portion of the seed layer.*

*14. The method of claim 10, wherein the substrate comprises an insulation layer on top such that the seed layer is formed on the insulation layer of the substrate.*

*15. The method of claim 10, wherein electroplating in the step (c) is to a level that does not exceed a height of the first photoresist layer.*

*16. The method of claim 10, wherein the gold bumps formed in the step (c) have a height in a range of about 10 nm to 19 μm.*

*17. The method of claim 10, wherein the seed layer comprises an adhesion layer and an electrode layer, wherein the adhesion layer has a thickness of about 10 nm to 100 nm, wherein the electrode layer has a thickness of about 100 nm to 1000 nm.*

*18. A flip chip manufacturing method comprising:*

*(a) forming a seed layer on a substrate by using a conductive thin layer;*

*(b) applying and patterning a photoresist or a dry film;*

*(c) forming gold bumps by electroplating;*

*(d) patterning the seed layer to form a metal pattern;*

*(e) forming an insulating layer on the seed layer and the upper end of the gold bumps; and*

*(f) applying and patterning a photoresist or a dry film so as to pattern the insulating layer,*

*wherein the metal pattern forms electrical connection between the gold bumps, and the polarity of the photoresist or a dry film in the step (b) is opposite to the polarity of photoresist or a dry film in the step (f),*

*wherein the step (c) of forming gold bumps comprises electroplating at least two gold bumps using the seed layer as an electrode so that no electrode wire is needed to form the at least two gold bumps.*

*19. The method of claim 18,*

*wherein the step (d) of patterning the seed layer to form a metal pattern comprises:*

*forming another photoresist layer that covers the at least two gold bumps, covers a first portion of the seed layer, and does not cover a second portion of the seed layer,*

*subsequently etching the second portion of the seed layer that is not covered by the other photoresist layer while maintaining the at least two gold bumps and also maintaining the first portion of the seed layer that are covered by the other photoresist layer, and*

*subsequently removing the other photoresist layer to provide the metal pattern that comprises the first portion of the seed layer and does not comprise the second portion of the seed layer.*

*20. The method of claim 18,*

*wherein patterning the seed layer in the step (d) maintains a first portion of the seed layer and removes a second portion of the seed layer which exposes a portion of the substrate, whereby the metal pattern formed in the step (d) comprises the first portion of the seed layer and does not comprise the second portion of the seed layer,*

*wherein the insulating layer formed in the step (e) is provided over the upper end of the at least two gold bumps and over the first portion of the seed layer,*

*wherein the step of (f) applying and patterning removes the insulation layer provided over the upper end of the at least two gold bumps while maintaining the insulation layer over the first portion of the seed layer,*

*wherein the method provides a flip chip device comprising the substrate, the metal pattern, the at least two gold*

*bumps, and the insulating layer, wherein the metal pattern is formed on the substrate and comprises the first portion of the seed layer that interconnects the at least two gold bumps, wherein the insulating layer remains over the first portion of the seed layer.*

*21. The method of claim 18,*

*wherein patterning the seed layer in the step (d) maintains a first portion of the seed layer and removes a second portion of the seed layer which exposes a portion of the substrate, whereby the metal pattern formed in the step (d) comprises the first portion of the seed layer and does not comprise the second portion of the seed layer,*

*wherein the insulating layer formed in the step (e) is provided over the upper end of the at least two gold bumps and over the first portion of the seed layer,*

*wherein the step of (f) applying and patterning a photoresist or a dry film comprises:*

*forming another photoresist layer over the insulating layer,*

*patterning the other photoresist layer such that the other photoresist layer stays over the insulating layer formed over the first portion of the seed layer while exposing the insulating layer formed over the upper end of the gold bumps,*

*subsequently etching the insulating layer formed over the upper end of the gold bumps to expose the upper end of the gold bump while maintaining the other photoresist layer staying over the insulating layer formed on the first portion of the seed layer, and*

*subsequently, removing the other photoresist layer to provide the flip chip device.*

*22. A flip chip manufacturing method comprising:*

*(a) forming a seed layer on a substrate by using a conductive thin layer;*

*(b) applying and patterning a photoresist or a dry film;*

*(c) forming gold bumps by electroplating;*

*(d) patterning the seed layer to form a metal pattern;*

*(e) forming an insulating layer on the seed layer and the upper end of the gold bumps; and*

*(f) applying and patterning a photoresist or a dry film so as to pattern the insulating layer,*

*wherein the metal pattern forms electrical connection between the gold bumps, and the polarity of the photoresist or a dry film in the step (b) is opposite to the polarity of photoresist or a dry film in the step (f),*

*wherein the step (b) of applying and patterning a photoresist or a dry film comprises:*

*forming a first photoresist layer over the seed layer; and*

*patterning the first photoresist layer with a first mask to form at least two openings through the first photoresist layer to expose the seed layer;*

*wherein the step (c) of forming gold bumps comprises electroplating gold in the at least to openings to form at least two gold bumps, in which the seed layer works as an electrode for electroplating so that no separate electrode wire for electroplating is needed to form the at least two gold bumps;*

*wherein subsequent to electroplating, the first photoresist layer covering the seed layer is removed to provide an intermediate structure comprising the substrate, the seed layer on the substrate, and the gold bumps on the seed layer;*

*wherein the step (d) of patterning the seed layer to form a metal pattern comprises:*

*forming a second photoresist layer over the intermediate structure such that second photoresist layer covers the at least two gold bumps, covers a first portion of the seed layer, and does not cover a second portion of the seed layer,*

*subsequently etching the second portion of the seed layer that is not covered by the second photoresist layer while maintaining the at least two gold bumps and also maintaining the first portion of the seed layer that are covered by the second photoresist layer, and*

*subsequently removing the second photoresist layer to provide the metal pattern that comprises the first portion of the seed layer and does not comprise the second portion of the seed layer;*

*wherein the step of (e) forming an insulating layer provides the insulating layer over the upper end of the gold bumps and also over the first portion of the seed layer that interconnects the two gold bumps;*

*wherein the step of (f) applying and patterning a photoresist or a dry film comprises:*

*forming a third photoresist layer over the insulating layer,*

*patterning the third photoresist layer using a second mask such that the third photoresist layer stays over the insulating layer formed over the first portion of the seed layer while exposing the insulating layer formed over the upper end of the gold bumps is exposed,*

*subsequently etching the insulating layer formed over the upper end of the gold bumps to expose the upper end of the gold bump while maintaining the third photoresist layer staying over the insulating layer formed over the first portion of the seed layer, and*

*subsequently, removing the third photoresist layer to provide a flip chip device comprising the substrate, the metal pattern, the at least two gold bumps, and the insulating layer, wherein the metal pattern is formed on the substrate and comprises the first portion of the seed layer that interconnects the at least two gold bumps, wherein the insulating layer remains over the first portion of the seed layer.*

*23. The method of claim 22, wherein etching the second portion of the seed layer exposes a portion of the substrate, wherein subsequent to removing the second photoresist layer the portion of the substrate is still exposed, wherein the insulating layer is formed on the portion of the substrate in addition to on the upper end of the gold bumps and on the first portion of the seed layer, wherein the third photoresist layer formed over the insulating layer is also over the portion of the substrate, wherein the third photoresist layer formed over the portion of the substrate remains after patterning the third photoresist layer, wherein the third photoresist layer formed over the portion of the substrates remains after etching the exposed insulating layer, wherein after removing the third photoresist layer, the insulating layer over the portion of the substrate is exposed in the flip chip device.*

*24. The method of claim 22, wherein the substrate comprises an insulation layer on top such that the seed layer is formed on the insulation layer of the substrate.*

*25. The method of claim 22, wherein the photoresist of the first photoresist layer has a positive polarity, and the photoresist of the third photoresist layer has a negative polarity.*

*26. The method of claim 22, wherein the seed layer comprises an adhesion layer and an electrode layer.*

* * * * *